United States Patent [19]

Sekine

[11] Patent Number: 5,499,933

[45] Date of Patent: Mar. 19, 1996

[54] PROBE PINS FOR INSPECTION AND SLIP-ON SOCKETS THEREOF

[75] Inventor: Hidenobu Sekine, Kashiwashi, Japan

[73] Assignee: Kouyou Electronics Appliances Co., Ltd., Chibaken, Japan

[21] Appl. No.: 402,983

[22] Filed: Mar. 13, 1995

Related U.S. Application Data

[63] Continuation of Ser. No. 151,873, Nov. 15, 1995, abandoned.

[30] Foreign Application Priority Data

Mar. 31, 1993 [JP] Japan ................. 5-015720 U

[51] Int. Cl.⁶ .................................. H01R 11/18
[52] U.S. Cl. ............................. 439/482; 439/82
[58] Field of Search .................. 439/482, 819–824, 439/700, 733, 736, 82, 84; 324/158 P, 158 F

[56] References Cited

U.S. PATENT DOCUMENTS

| | | | |
|---|---|---|---|
| 4,257,667 | 3/1981 | Iantorno | 439/82 |
| 4,709,973 | 12/1987 | Waters et al. | 439/82 |
| 4,894,031 | 1/1990 | Damon et al. | 439/82 |
| 5,135,403 | 8/1992 | Rinaldi | 439/82 |
| 5,159,265 | 10/1992 | Alfonso et al. | 439/482 |
| 5,225,773 | 7/1993 | Richards | 439/482 |

*Primary Examiner*—Larry I. Schwartz
*Assistant Examiner*—Hien D. Vu
*Attorney, Agent, or Firm*—Longacre & White

[57] ABSTRACT

A probe pin for inspection composing a unit to inspect a printed circuit is formed with a conductive metallic tube into which a plunger is inserted with a spring. The plunger is slidably projected from the top end of the conductive metallic tube and a plurality of hollow salients are formed symmetrically on outer surface of the conductive metallic tube to extend in the axial direction so that the conductive metallic tube is easily pushed into a plurality of holding openings formed on an insulated holding plate. Thus, the probe pins come in contact with each contact on the printed circuit without coming off, slanting or bending of the conductive metallic tube or further without breaking the salients or without deviating the installation of the conductive metallic tube from the holding openings on the holding plate, and a slip-on socket is provided to mate with the probe pin for inspection.

3 Claims, 4 Drawing Sheets

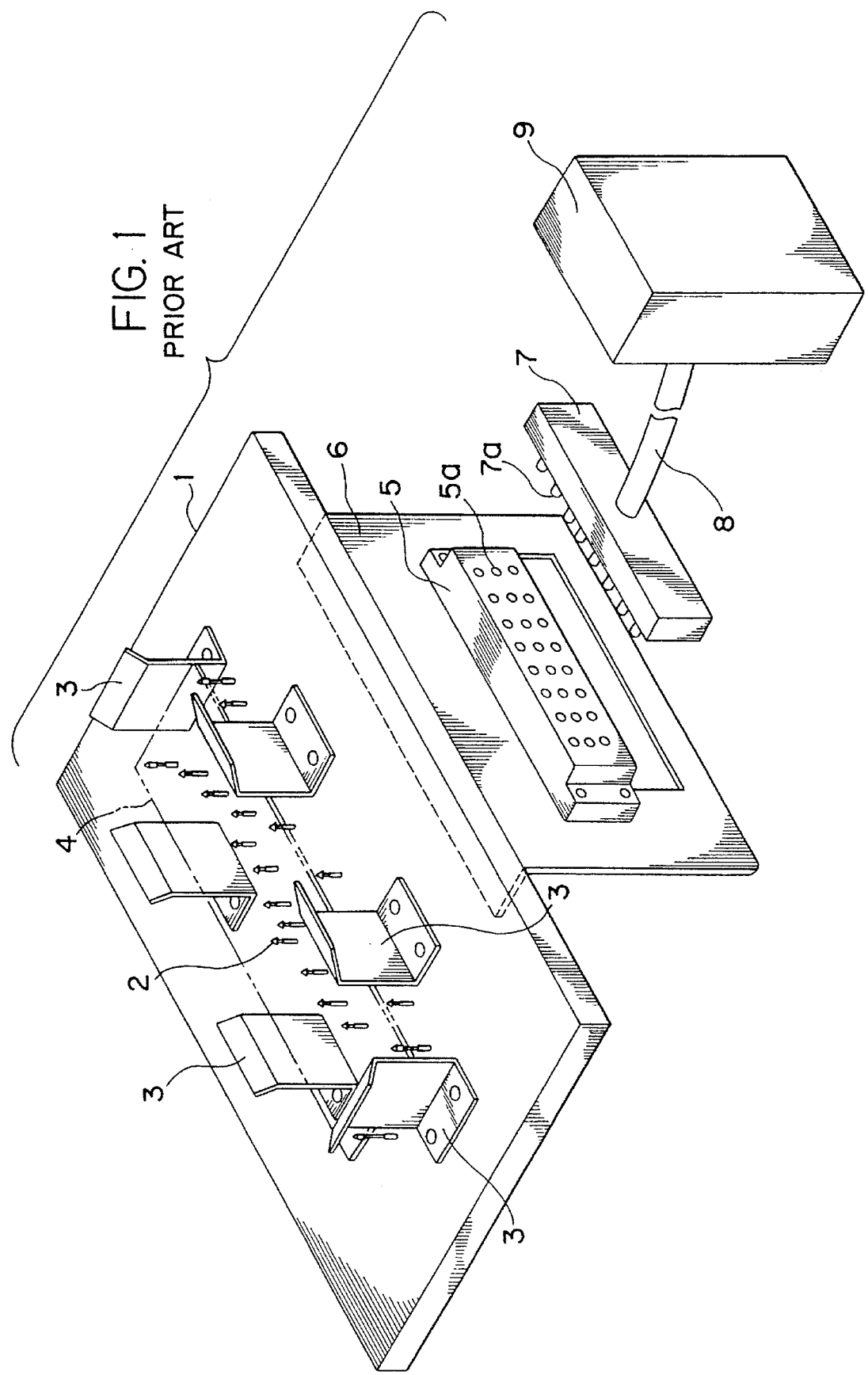

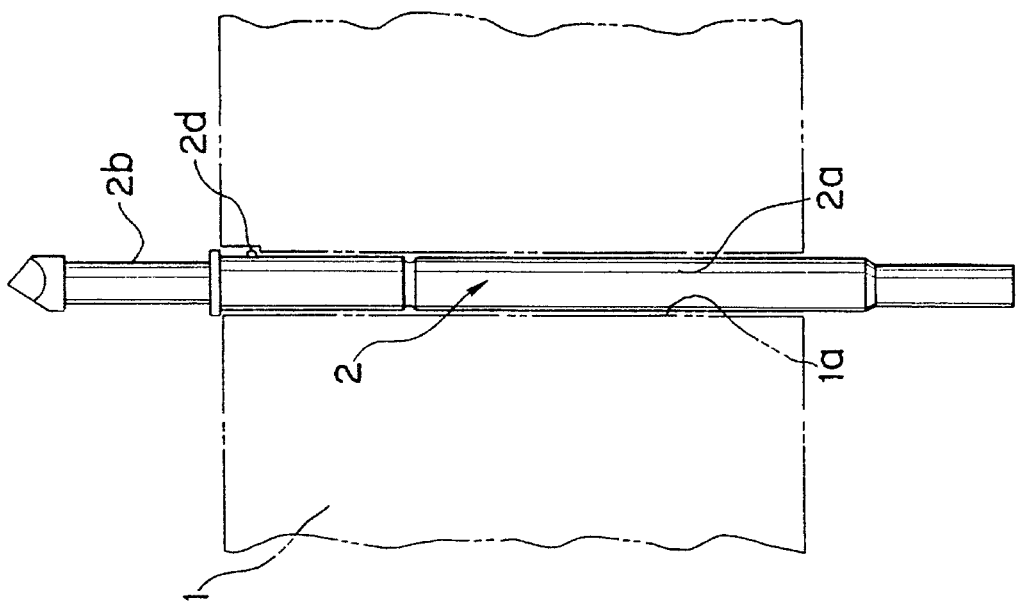
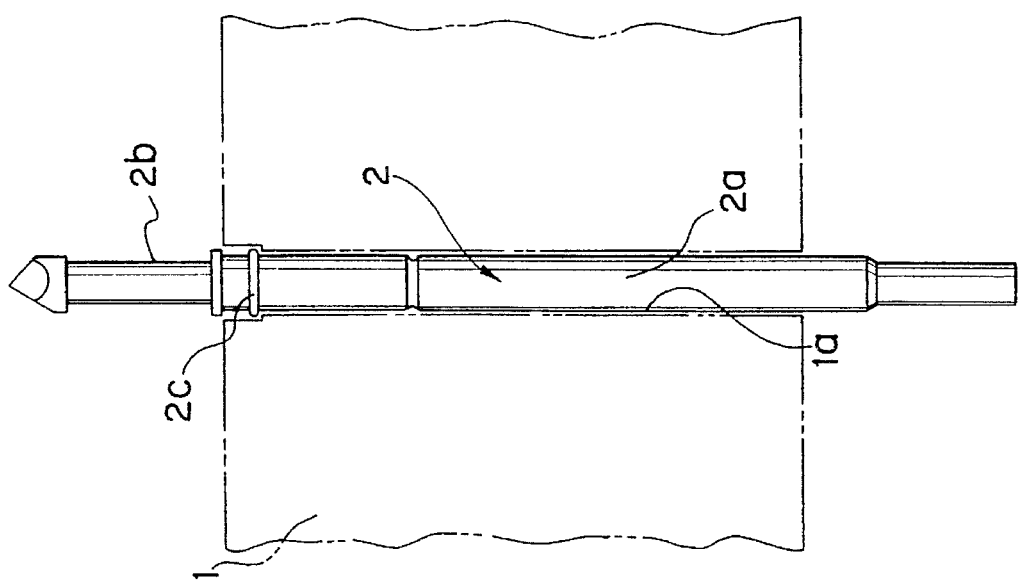

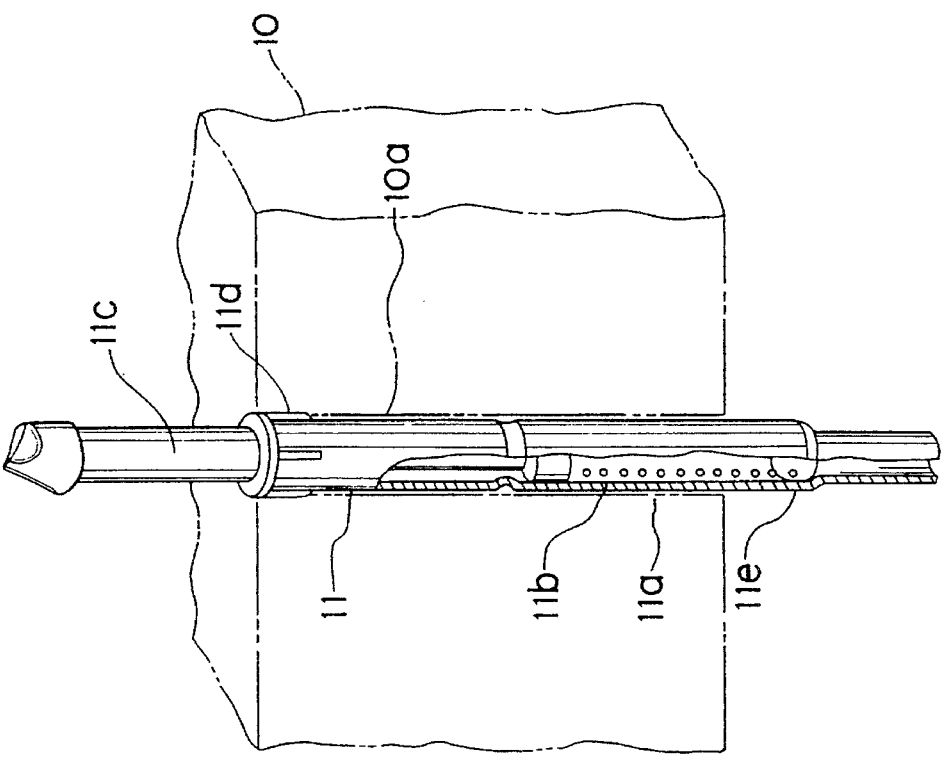
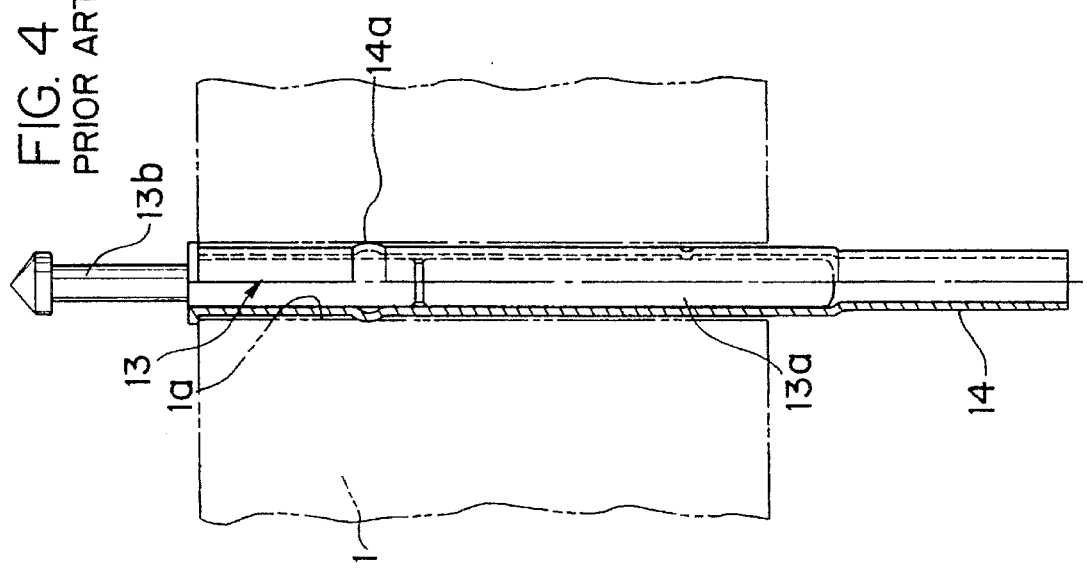

PROBE PINS FOR INSPECTION AND SLIP-ON SOCKETS THEREOF

This is a continuation of application Ser. No. 08/151,873, filed Nov. 15, 1993, which was abandoned upon the filing hereof.

BACKGROUND OF THE INVENTION

1. Field of the Invention

This invention relates to an improvement of probe pins for inspection of printed circuit boards and slip-on sockets thereof whereby a unit to inspect a printed circuit comprises a plurality of the probe pins pushed into holding openings formed on an insulated holding plate. For inspection of the circuit board, each probe pin contacts with each of the corresponding contacts of the printed circuit.

2. Description of the Related Art

FIG. 1 is a perspective view showing a conventional inspection unit for a printed circuit whereby an insulated holding plate 1 is provided with holding openings thereon into which a plurality of probe pins 2 for inspection are pushed to inspect the printed circuit. Guide flaps 3 provided in plurality around a group of the probe pins 2 guide the printed circuit substrate 4 into contact with the probe pin 2. Female connector 5 having a plurality of female contacts 5a is supported on the insulated holding plate 1 by means of a supporting plate 6, and the connection between each female contact 5a and each probe pin 2 is made with a leading wire (not shown). A male connector 7, having male contacts 7a, which can connect with the female contacts 5a, and a cable 8 tying up the leading wires, is connected with an inspection unit 9.

FIG. 2 indicates an example of the conventional inspection probe pin 2 comprising a conductive metallic tube 2a and a plunger 2b which is inserted into the tube 2a to act against a spring (not shown) so as to form a movable plunger 2b extending from the top of the tube 2a. A ring shaped salient 2c is provided around the top of the tube 2a. Each of the probe pins 2 is planted tightly on the insulated holding plate 1 by pushing the tube 2a into the holding opening 1a formed precisely on the holding plate 1 by means of NC machines (numerically controlled machines), or other suitable means.

FIG. 3 shows another example of the conventional probe pin 2 for inspection. The probe pin of FIG. 3 differs from the former example in that a salient 2d is provided at the outer surface of the top of the conductive metallic tube 2a. FIG. 4 indicates another example of a probe pin 13 for inspection formed by means of a plunger 13b being inserted into a conductive metallic tube 13a with a spring (not shown). The plunger 13b is movably projected from the top of the tube 13a. The pins 13 are insert into a slip-on socket 14 which is pushed into a holding opening 1a provided in plurality on an insulated holding plate 1, and a ring shaped salient 14a is formed around the top end of the slip-on socket 14 with the salient 14a being pushed into the holding opening 1a on the insulated holding plate 1.

However, as the conventional probe pin for inspection shown in FIG. 2 has the ring shaped salient 2c around the top end of the conductive metallic tube 2a, it is difficult to push the ring shaped salient 2c into the holding opening 1a precisely formed on the insulated holding plate 1 without bending or slanting the pins or crushing the ring shape salient. Moreover, the inner surface of the conductive metallic tube 2a may be deformed to prevent the plunger 2b from its movement.

The conventional probe pin 2 indicated in FIG. 3 suffers from the problem that when the salient 2d provided on outer surface of the top end of the conductive metallic tube 2a is pushed into the holding opening 1a, the installation position of the conductive metallic tube 1a is likely to deviate from the holding opening 1a, the diameter of which is precisely formed on the holding plate 1.

In the example described in FIG. 4, it is difficult to push the ring shaped salient 14a provided on outer surface of the top end of slip-on socket 14 for the probe pin 13 for inspection into the holding opening 1a formed on the insulated holding plate without slanting or bending the slip-on socket or crushing the ring shaped salient 14a to deform inner surface of the slip-on socket. As a result, it is difficult to remove a damaged probe pin 13.

In order to eliminate such problems, it will be easy to enlarge the holding opening 1a formed on the insulated holding plate, but the alignment will then become incorrect and the conductive metallic tube 2a or the slip-on socket forming the probe pin would easily come off from the holding opening 1a.

In order to prevent such a drawback, a shrinkable tube may be mounted on the projected portion of the conductive metallic tube 2a or the slip-on socket 14 from the lower surface of the insulated holding plate 1, or the conductive metallic tube 2a or the slip-on socket 14 may be fastened on the insulated holding plate with a bonding agent. These additional processes cause problems posing a more complex and costly operation.

SUMMARY OF THE INVENTION

The object of this invention is to present a probe pin for inspection comprising a conductive metallic tube and a slip-on socket into which the probe pin can be relatively easily pushed, and whereby the conductive metallic tube can be pushed into a holding opening, the diameter of which is made very precisely on an insulated holding plate, without bending or slanting or coming off the tube or the slip-on socket. Moreover, a constant pin height is achieved by providing a plurality of radially symmetric salients on the outer surface of the conductive metallic tube or on outer surface of the slip-on socket to extend in the axial direction.

As shown in FIG. 5, the probe pin for inspection of this invention is pushed into the holding opening 10a formed in plurality on the insulated holding plate 10 so as to contact with each contact on a printed circuit. The probe pin 11 provided in an inspection unit for a printed circuit is characterized by inserting a plunger 11c into the conductive metallic tube 11a which is pushed into the holding opening 10a formed in plurality on the insulated holding plate 10. The plunger 11c slidably projects from the top end of the conductive metallic tube 11a and resiliently acts against the spring 11b. A plurality of radially symmetric salients 11d are provided on an outer surface of the conductive metallic tube 11a These elongated splines make it easy to push the probe pin into the holding opening.

With reference to FIG. 6, the slip-on socket 12 which receives the inspection probe pin of this invention is pushed into the holding opening 10a formed in plurality on the insulated holding plate 10. The inspection probe pin 11 comprises a conductive metallic tube 11a into which the plunger 11c is inserted. A spring 11b is provided in the tube 11a and resiliently acts on the plunger 11c which slidably projects from the top end of the conductive metallic tube 11a. The probe pin 11 is inserted into the slip-on socket 12 and the salients 12a in plurality are formed to be radially symmetric about the outer surface of the slip-on socket 12 in the axial direction, similar to the salient 11d (FIG. 5).

As stated above, the construction of the probe pin for the inspection of a printed circuit according to this invention is made so as to be able to easily push the probe pin for inspection into the holding opening 10a formed on the holding plate 10. The salient 11d is formed in symmatric plurality on outer surface of the conductive metallic tube 11a to extend in the axial direction. Thus, slanting or bending of the tube 11a is prevented, and hence, the conductive metallic tube 11a can be installed in the holding opening 10a formed precisely on the insulated holding plate 10 without deviating from the holding opening 10a.

Further, because the slip-on socket 12 of the probe pin according to this invention has the salient 12a formed in symmatric plurality on its outer surface, the salient 12a can also be easily pushed into the holding opening 10a formed on the insulated holding plate 10 without bending or slanting thereof. As the salients 12a are symmetrically formed in plurality on outer surface of the slip-on socket in the axial direction, the slip-on socket 12 can be installed in the holding opening 10a formed precisely on the insulated holding plate 10 without deviating from the holding opening 10a.

The probe pin for the inspection of a printed circuit, as stated above, can be easily pushed into the holding opening formed on the insulated holding plate without bending or slanting thereof with the salients formed in symmetric plurality on the outer surface of the conductive metallic tube and as the salients are formed on outer surface of the conductive metallic tube to be hollow, the conductive metallic tube can be installed in the holding opening formed precisely on the insulated holding plate without deviating from the holding opening due to the resilient nature of these hollow salients.

Similarly, as described above, the slip-on socket for the probe pin for inspection of this invention has hollow salients formed in symmatric plurality on outer surface of the conductive metallic tube to extend in the axial direction, and hence, the salient can be pushed easily into the holding opening formed on the holding plate without bending or slanting thereof; and as the salient is provided on outer surface of the conductive metallic tube symmetrically in the axial direction, the conductive metallic tube can also be pushed into the holding opening formed precisely on the insulated holding plate without deviating from the holding opening.

BRIEF DESCRIPTION OF THE DRAWINGS

FIG. 1 is a perspective view of a conventional inspection unit for a printed circuit.

FIG. 2 is a description of a conventional probe pin for inspection.

FIG. 3 is a description of another conventional probe pin.

FIG. 4 is a sectional view of an enlarged conventional probe pin for inspection inserted in a slip-on socket.

FIG. 5 is a sectional view of the enlarged probe pin for the inspection of a printed circuit according to this invention.

FIG. 6b is a cross sectional view of FIG. 6a taken along section line VI—VI of FIG. 6a;

FIG. 7 is a view indicating a production step of the probe pin for the inspection of a printed circuit according to this invention.

DESCRIPTION OF THE PREFERRED EMBODIMENTS

Figure 6A:
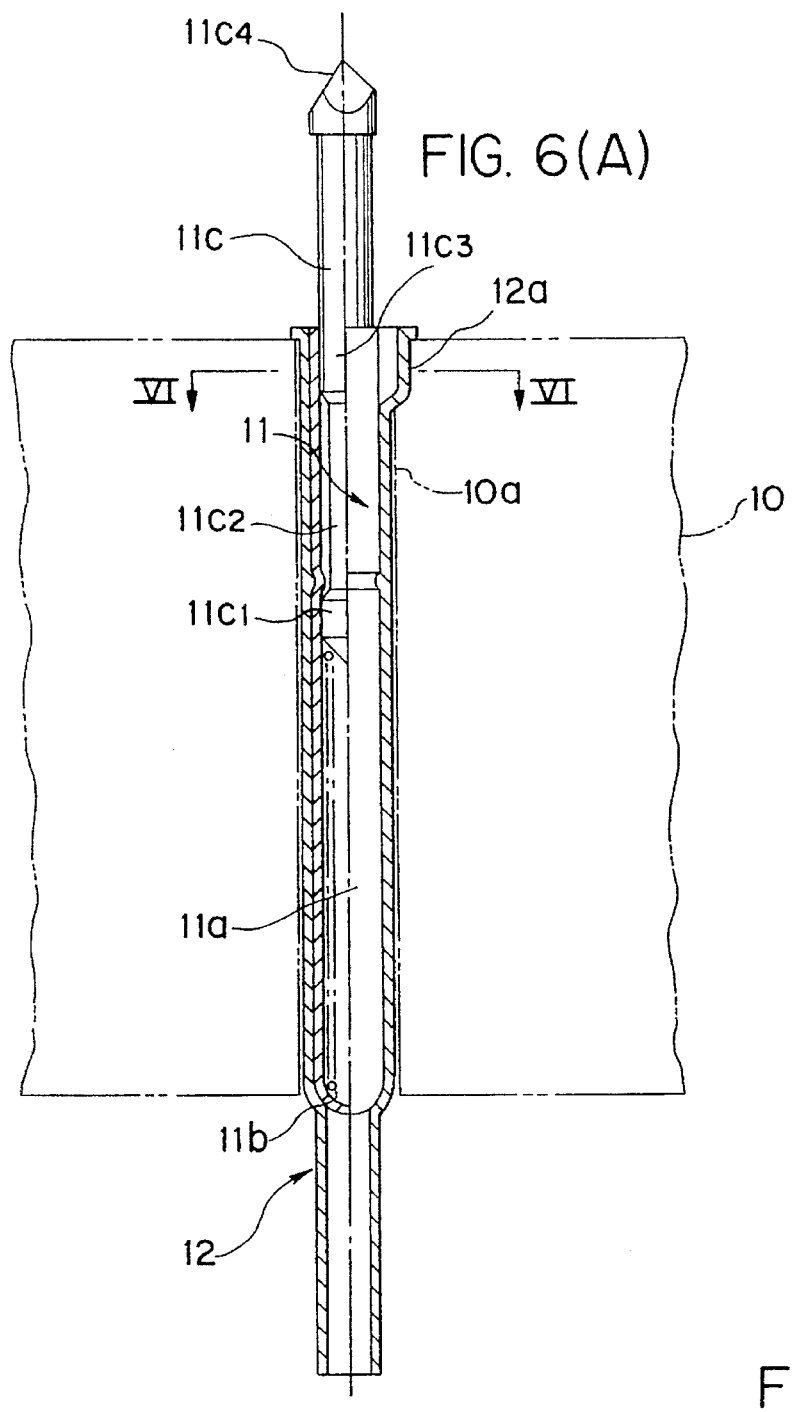
FIG. 6a is a sectional view of the enlarged probe pin for inspection inserted in the slip-on socket according to this invention.

An example of the probe pin for the inspection of a printed circuit is described by referring to the drawings attached hereto as follows:

FIG. 5 shows a sectional view of the enlarged probe pin for the inspection of a printed circuit in accordance with this invention. A plurality of probe pins 11 are planted or inserted in the insulated holding plate 10 so as to come in contact with each contact of a printed circuit and is formed with the conductive metallic tube 11a which can be pushed into the holding opening 10a formed precisely by means of NC (Numerically Controlled) machines on the insulated holding plate 10. The plunger 11c is inserted into the conductive metallic tube 11a and engages the spring 11b with the plunger being projected slidably from the top end of the conductive metallic tube 11a. The salients 11d are formed in plurality (3 in the example) to be symmetrically disposed about the on outer surface of the top end of the conductive metallic tube 11a, and to extend in the axial direction.

FIG. 7 indicates a production step of the probe pin for inspection in accordance with this invention and as shown in FIG. 7(A), a long conductive metallic tube is cut into a specified length to give the conductive metallic tube 11a. The lower portion $11_{a1}$ of the conductive metallic tube 11a is squeezed down to a smaller diameter and the salient 11d is formed in plurality (3 in the example) on outer surface of the top end $11_{a2}$ of the tube 11a to extend in the axial direction by pushing a mould (not shown) into the top end $11_{a2}$, and so on. As shown in FIG. 7(B), a ball 11e is put in the conductive metallic tube 11a which stops at the squeezed portion of the lower portion $11_{a1}$ of the conductive metallic tube 11a. As shown by FIG. 7(C), the spring 11b is put in the conductive metallic tube 11a to push the ball 11e with the lower end of the spring 11b. As indicated by FIG. 7(D), the plunger 11c is put on the spring 11b. The plunger 11c is provided with the lower portion $11_{c1}$ having the substantially identical diameter to the inner diameter of the conductive metallic tube 11a. The portion $11_{c2}$, having a smaller diameter, is provided between the lower portion $11_{c1}$ and a specified elevated position. And further, a pointed portion $11_{c4}$ is formed on the top end of the upper portion $11_{c3}$ having an approximately identical diameter to the inner diameter of the conductive metallic tube. The outer surface of the tube 11a corresponding to the reduced diameter portion 11c2 shall be squeezed or pinched as indicated by FIG. 7(D) to form the salient $11_{a3}$. The salient $11_{a3}$ projects into the tube 11a so as to contact the reduced diameter portion $11_{c2}$, and comes in contact with the lower portion $11_{c1}$ of the plunger 11c to prevent the plunger 11c from coming off from the top end of the conductive metallic tube 11a. The probe pin for inspection of this invention is provided as described above, with the salients 11d symmetrically formed in plurality on outer surface of the conductive metallic tube 11a to extend in the axial direction and the salient 11d is easily pushed into the holding opening 10a formed on the insulated holding plate 10 without bending or slanting thereof, and because the salient 11d is formed as a hollow projection on outer surface of the conductive metallic tube 11a, the conductive metallic tube 11a can be installed in the holding opening 10a formed precisely on the insulated holding plate 10 without deviating from the holding opening 10a.

Figure 6B:
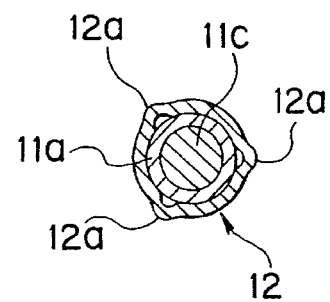

FIG. 6a is a sectional view of enlarged probe pin 11 for inspection inserted into the slip-on socket 12. The inspection probe pin 11 is comprised of the conductive metallic tube 11a into which the plunger 11c is inserted. The spring 11b resiliently acts against the plunger 11c which slidably projects from the top end of the conductive metallic tube 11a. The probe pin 11 is inserted in the slip-on socket 12 pushed into the holding opening 10a formed in plurality on the insulated holding plate so as to come into contact with each contact of a printed circuit. The salient 12a is symmetrically formed in plurality on outer surface of the slip-on socket 12 in the axial direction (see FIG. 6b).

The slip-on socket of this invention similarly has the salient 12a formed as a hollow projection on outer surface of the slip-on socket 12 and hence the salient 12a can be easily pushed into the holding opening 10a formed on the insulated holding plate 10 without bending or slanting thereof. Because the salient 12a is formed symmetrically on outer surface of the slip-on socket in the axial direction, the slip-on socket 12 can be installed without deviating from the holding opening formed precisely on the insulated holding plate 10.

While the invention has been particularly shown and described with reference to the accompanying drawings, it will be understood by those skilled in the art that various changes in form and detail may be made without departing from the spirit and scope of the invention.

I claim:

1. An inspection unit having an inspection probe pin for inspecting a printed circuit board, the inspection unit further comprising an insulated holding plate and at least one holding opening provided on said holding plate, said probe pin comprising:

a conductive metallic tube inserted into said holding opening and defining an axial direction, said conductive metallic tube comprising an outer surface defining an outer radial dimension which is substantially equal to an inner radial dimension of said holding opening, an inner radial dimension, and an opening at a top end of said metallic tube;

a plunger means for contacting a contact of the printed circuit, said plunger being received in the opening of said conductive metallic tube and slidably projecting from the top end of the conductive metallic tube;

a resilient means for resiliently acting against said plunger;

wherein a plurality of radially symmetric elongated splines are formed on the conductive metallic tube, said splines extend in said axial direction from said opening of said top end to a lower portion of said metallic tube and project radially beyond said outer radial dimension, and wherein said elongated splines define a hollow portion therein, said hollow portion extending radially beyond said inner radial dimension whereby said probe pin can be pushed into the holding opening with a reduced risk of bending.

2. An inspection unit having an inspection probe pin for inspecting a printed circuit, the inspection unit further comprising an insulated holding plate and a plurality of holding openings provided in said holding plate, said probe pin comprising;

a slip-on socket inserted into said holding opening, said slip-on socket comprising an outer radial dimension, and an opening at an axial end thereof;

a conductive metallic tube adapted to be received within said opening of said slip-on socket;

a plunger means for contacting a contact of the printed circuit, said plunger being received in the conductive metallic tube and slidably projecting from the top end of the conductive metallic tube;

a resilient mean for resiliently acting against said plunger;

wherein a plurality of radially symmetric elongated salients are formed on an outer circumferential surface of the slip-on socket, and extend in an axial direction of said slip-on socket from said axial end to a lower portion of said slip-on socket, said salients projecting radially beyond said outer radial dimension, and wherein said elongated splines define a hollow portion therein, said hollow portion extending radially beyond said inner radial dimension whereby said probe pin can be pushed into the holding opening with a reduced risk of bending.

3. An inspection unit having slip-on socket receiving an inspection probe pin for inspecting a printed circuit board, the inspection unit further comprising an insulated holding plate and at least one holding opening provided on said holding plate, said probe pin comprising:

a conductive metallic tube adapted to be received within said slip-on socket;

a plunger means for contacting a contact of the printed circuit, said plunger being received in the conductive metallic tube and slidably projecting from the top end of the conductive metallic tube;

a resilient means for resiliently acting against said plunger;

wherein said slip-on socket is inserted into said holding openings and defines an outer radial dimension which is substantially equal to an inner radial dimension of said holding opening, an inner radial dimension and an opening at a top axial end thereof, said slip-on socket comprising a plurality of radially symmetric elongated salients extending in an axial direction from said top axial end to a lower portion of said slip-on socket and projecting radially beyond said outer radial dimension, and wherein said elongated splines define a hollow portion therein, said hollow portion extending radially beyond said inner radial dimension whereby said probe pin can be pushed into the holding opening with a reduced risk of bending.

* * * * *